United States Patent
Mos et al.

(10) Patent No.: US 8,504,333 B2
(45) Date of Patent: Aug. 6, 2013

(54) METHOD FOR SELECTING SAMPLE POSITIONS ON A SUBSTRATE, METHOD FOR PROVIDING A REPRESENTATION OF A MODEL OF PROPERTIES OF A SUBSTRATE, METHOD OF PROVIDING A REPRESENTATION OF THE VARIATION OF PROPERTIES OF A SUBSTRATE ACROSS THE SUBSTRATE AND DEVICE MANUFACTURING METHOD

(75) Inventors: Everhardus Cornelis Mos, Best (NL); Hubertus Johannes Gertrudus Simons, Venlo (NL); Scott Anderson Middlebrooks, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 373 days.

(21) Appl. No.: 12/816,723

(22) Filed: Jun. 16, 2010

(65) Prior Publication Data
US 2011/0010000 A1    Jan. 13, 2011

Related U.S. Application Data

(60) Provisional application No. 61/219,981, filed on Jun. 24, 2009.

(51) Int. Cl.
*G06F 7/60* (2006.01)
*G06F 17/10* (2006.01)

(52) U.S. Cl.
USPC ............ 703/2; 716/51; 382/151; 438/14

(58) Field of Classification Search
USPC .................................................. 703/2
See application file for complete search history.

(56) References Cited

U.S. PATENT DOCUMENTS

| 6,389,366 | B1 * | 5/2002 | Heavlin .................... 702/84 |
| 6,766,214 | B1 * | 7/2004 | Wang et al. .................. 700/121 |
| 6,975,974 | B2 * | 12/2005 | Chien et al. ................... 703/2 |
| 7,050,957 | B2 * | 5/2006 | Stanton ..................... 703/13 |
| 7,259,828 | B2 | 8/2007 | Tolsma et al. |
| 7,502,715 | B1 | 3/2009 | Middlebrooks |
| 8,289,515 | B2 * | 10/2012 | Cohen et al. .................. 356/369 |
| 2006/0266243 | A1 * | 11/2006 | Percin et al. ................. 101/484 |
| 2011/0196646 | A1 | 8/2011 | Mos et al. |

FOREIGN PATENT DOCUMENTS
WO    WO 98/39689    9/1998

OTHER PUBLICATIONS

Maciejowski, J.M., "Predictive Control with Constraints," Prentice Hall, Sep. 2000; p. 226.

\* cited by examiner

*Primary Examiner* — Mary C Jacob
(74) *Attorney, Agent, or Firm* — Sterne, Kessler, Goldstein & Fox P.L.L.C.

(57) ABSTRACT

A method for selecting sample positions on a substrate from a set of all available sample positions is provided, in which a representation of a model, which may represent the variation of one or more properties across the substrate, is analyzed in order to identify the sample positions having the greatest effect on the model.

13 Claims, 6 Drawing Sheets

US 8,504,333 B2

METHOD FOR SELECTING SAMPLE POSITIONS ON A SUBSTRATE, METHOD FOR PROVIDING A REPRESENTATION OF A MODEL OF PROPERTIES OF A SUBSTRATE, METHOD OF PROVIDING A REPRESENTATION OF THE VARIATION OF PROPERTIES OF A SUBSTRATE ACROSS THE SUBSTRATE AND DEVICE MANUFACTURING METHOD

CROSS REFERENCE TO RELATED APPLICATIONS

This application claims benefit under 35 U.S.C. 119(e) to U.S. Provisional Patent Application No. 61/219,981, filed Jun. 24, 2009, which is incorporated by reference herein in its entirety.

BACKGROUND

1. Field of the Invention

The present invention relates to a method for selecting sample positions on a substrate a method for providing a representation of a model of properties of a substrate, a method of providing a representation of the variation of properties of a substrate across the substrate and a device manufacturing method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to allow a number of patterned layers to be positioned on the substrate, it is desirable to accurately set the position of the substrate relative to the radiation beam and the patterning device. This may be performed by accurately positioning the substrate on a substrate table and positioning the substrate table relative to the radiation beam and the patterning device.

Alignment of the substrate may be performed. In one alignment system, a number of alignment marks on the substrate are measured to derive a coordinate system, which is compared to a modelled grid to derive the positions of features on the substrate. Clamping of the substrate on the substrate table, or wafer distortion occurring in non-lithography process steps, may cause distortion of the substrate, which can be monitored by comparison of the measurements to the grid. Models describing the wafer grid may be created which are used in exposing wafers so as to compensate for the distortions.

Measurements of the overlay, i.e., the alignment of successive layers formed on the substrate, may also be made using a modelled grid. Grid models describing the overlay error over the substrate with respect to the previous layer may be produced and used in a control loop to ensure lot to lot consistency.

In order to provide a useful model for substrate properties, such as the overlay error, across the substrate, a number of positions at which measurements may be made may be required. Accordingly, when a layout of a substrate, namely the arrangement of patterns to be formed on the substrate, is planned, a number of sample positions are provided. The requisite substrate property, such as the overlay error may be measured at each sample position or derived from measurements made at each sample position.

However, a finite amount of time is required to measure a desired property of the substrate at each sample position. Accordingly, although measuring the properties of the substrate at every sample position may provide a large amount of data for use in modeling the variation of the substrate property across the substrate, the amount of time taken to perform the measurements may be undesirable.

It has therefore previously been known to use a selection of the available sample positions, based on the intuition and/or experience of the user regarding which of the available sample positions should be used.

SUMMARY

Therefore, what is needed is a method and system for objectively selecting sample positions to be used on a substrate.

According to a first embodiment of the invention, there is provided a method for selecting a subset of sample positions from a set of available sample positions on a substrate processed in a lithographic process, the subset to be used to assess the variation of one or more properties of the substrate across the substrate, comprising the following steps. Defining an initial representation of a model of the variation of the one or more properties of the substrate across the substrate. The initial representation of the model configured such that it may represent the variation of the one or more properties of the substrate across the substrate when provided with measurements of the one or more properties of the substrate at the available sample positions on the substrate. Analyzing the initial representation of the model in order to determine the effect of the measurements from each of the available sample positions on the model. Selecting for the subset of sample positions the sample positions of the available sample positions that are identified in the analysis of the initial representation of the model as having the greatest effect on the model.

According to another embodiment of the invention, there is provided method of providing a representation of a model of the variation across a substrate of one or more properties of a substrate processed in a lithographic apparatus comprising the following steps. Identifying a plurality of available sample positions on the substrate at which a measurement of the one or more properties of the substrate may be made. Defining an initial representation of a model of the variation of the one or more properties of the substrate across the substrate. The initial representation of a model configured such that it may represent the variation of the one or more properties of the substrate across the substrate when provided with measurements of the one or more properties of the substrate at the available sample positions on the substrate. Analyzing the initial representation of the model in order to determine the effect of the measurements from each of the available sample positions on the model. Selecting from the available sample positions, a subset of sample positions that are identified in the analysis of the initial representation of the model as having the greatest effect on the model. Defining a revised representation of the model of the variation of the one or more properties of the substrate across the substrate. The revised representation of the model configured such that it may represent the variation of the one or more properties of the substrate across the substrate when provided with measurements of the one or more properties of the substrate at the subset of sample positions.

According to a further embodiment of the invention, there is provided a method of providing a representation of the variation of one or more properties of a substrate across a substrate that has been processed in a lithographic apparatus comprising the following steps. Providing a representation of a model of the variation of one or more properties of the substrate according to the method above. Measuring the one or more properties at the subset of sample positions to provide measurement data. Generating a representation of the variation of the one or more properties of the substrate across the substrate by providing the measurement data to the revised representation of the model.

According to a still further embodiment of the invention, there is provided a device manufacturing method comprising the following steps. Performing a first process of a lithographic process to a substrate. Providing a representation of the variation across the substrate of one or more properties of the substrate according to the method above; and performing a second process of a lithographic process to a substrate. The performance of the second process is controlled using the representation of the variation across the substrate of the one or more properties of the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention FIG. 1 depicts a lithographic apparatus, according to an embodiment of the invention.

Figure 1:
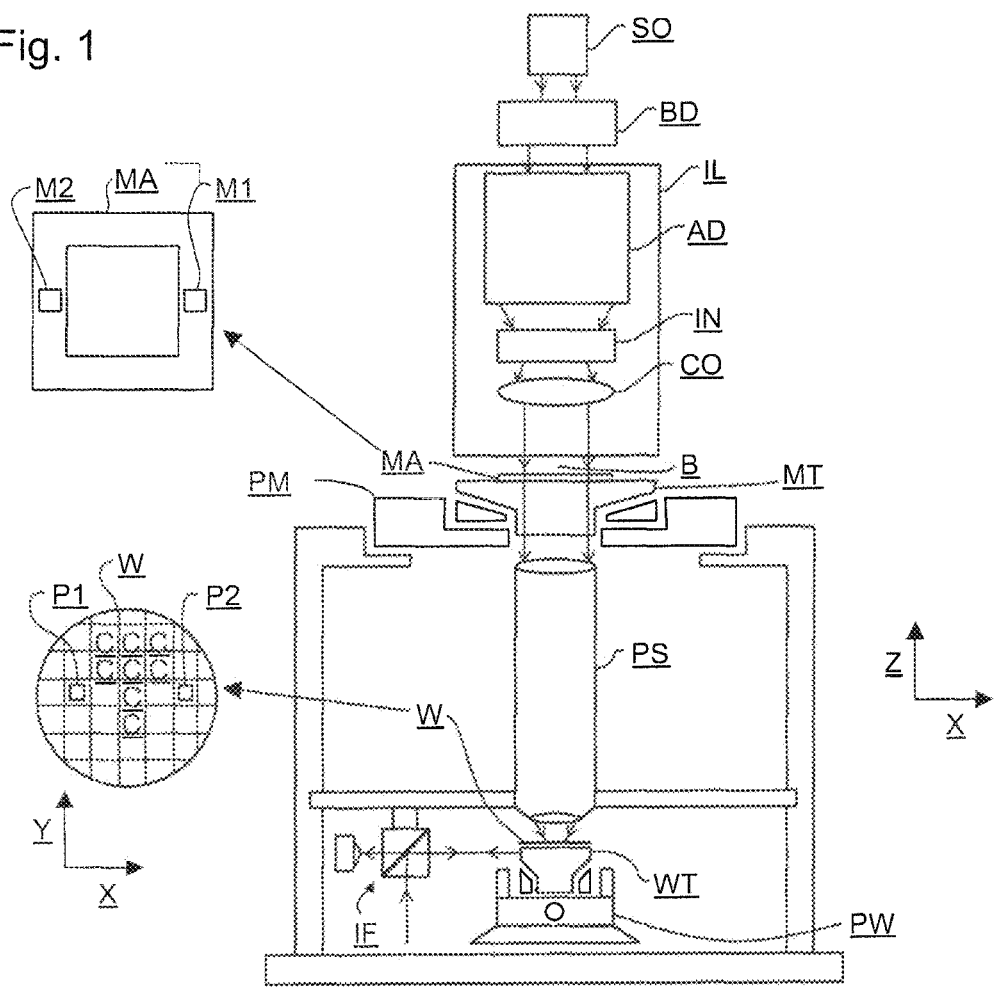

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, ware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus comprises: an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2.

Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Alignment may be performed, for example, by an alignment system as described in WO 98/039,689, which is incorporated by reference herein in its entirety.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
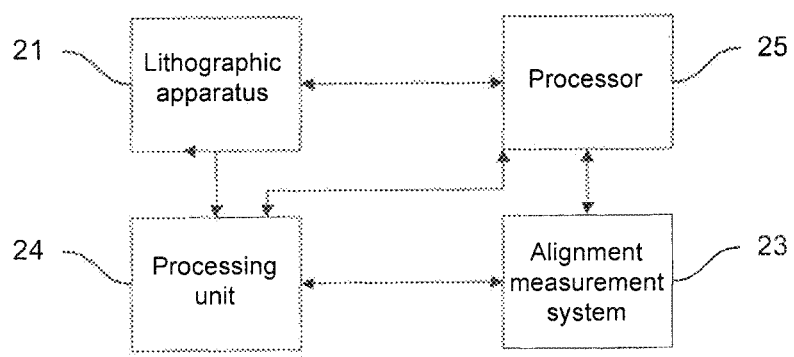
FIG. 2 depicts a lithographic system incorporating the lithographic apparatus of FIG. 1.

Referring now also to FIG. 2, in one embodiment of the invention, a lithographic apparatus 21, such as that illustrated in FIG. 1, may form part of a lithographic system comprising the lithographic apparatus 21, an alignment measurement system 23, arranged to measure parameters of the pattern deposited on the wafer W during the lithographic process and a processor 25.

The lithographic system may also comprise an additional processing unit 24, which may perform other processes to the substrate W that are part of the lithographic process. Such other processes may include applying a resist to the substrate, heating or cooling the substrate and developing resist that has been applied to the substrate and exposed with a pattern of radiation.

The processor 25 may be arranged to control the alignment measurement system 25 and may also provide suitable control signals to control the position of the substrate table relative to the radiation beam and/or the patterning device in the lithographic apparatus 21. The processor may also provide control signals to the additional processing unit 24. The alignment measurement system may, in particular, be arranged to measure parameters such as overlay or alignment, the data being analyzed in processor 25.

Figure 3:
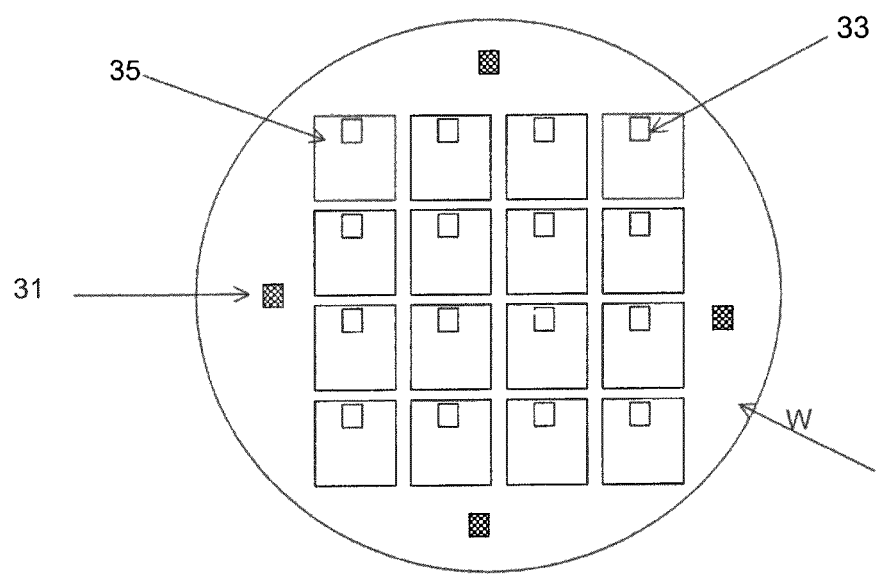
FIG. 3 depicts the alignment marks on a substrate being measured by the alignment system depicted in FIG. 2.

FIG. 3 is an example of the substrate alignment process and overlay measurement which may take place in the alignment measurement system of FIG. 2. In this example, the positions of four alignment marks 31 on the substrate W are measured. The measurement may take place, for example, using ASML's ATHENA™ Phase-Grating Alignment System in which dual-wavelength radiation is directed onto alignment marks in the form of diffraction gratings, as described in detail in WO 98/39689 referred to above. Alternative measurement techniques may include scanning electron microscopy. In this particular embodiment overlay is also measured using the overlay targets 33 positioned in each exposure location 35 on the substrate W.

Figure 4:
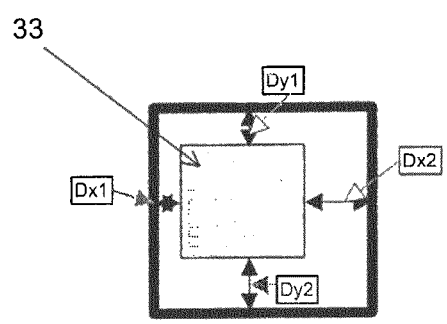
FIG. 4 depicts a detail of a measurement of the overlay error in FIG. 3.

As indicated in FIG. 4, two dimensional, that is X and Y direction, overlay error can be measured to calculate where the substrate stage has to move to expose a second layer on top of an already exposed first layer. In the X direction, the overlay is given by $(Dx2-Dx1)/2$ whilst in the Y direction the overlay error is given by $(Dy2-Dy1)/2$. It will be appreciated that different wafer models will lead to different exposure locations based on the same alignment mark location.

In accordance with an embodiment of the invention, one or more properties of the substrate, including, for example, one or more of alignment, overlay, line width critical dimension, sidewall angle and focus, may be measured at a number of points over the substrate W as described above. A combination of two orthogonal basis functions may be used to calculate a grid, the grid then enabling values for intermediate points to be calculated. Each of the basis functions may, for example, be chosen to be a polynomial which is orthogonal over a chosen interval and to be such that the coefficients of the polynomial can be completely determined by sampling at the roots, which is the zeros of the polynomials.

The measurements on the substrate may also be based on different co-ordinate systems such as the rotation of the X axis about the Z axis (Rzx) and/or the rotation of the Y axis about the Z axis (Rzy). Magnification of the image on the substrate relative to the pattern on the mask may also be measured. An intra-field alignment scheme may be used in which a die on a previous layer formed on the substrate is measured with respect to the chosen co-ordinate scheme.

The choice of basis function or functions will be influenced by the form of the substrate. For example, where the translations Tx and Ty of the alignment are to be measured over a circular substrate, with these translations denoted in polar co-ordinates $(r,\theta)$, basis functions which are orthogonal over the intervals $r=[0\ 1]$ and $\theta=[0\ 2\pi]$ with a periodicity of $2\pi$ are suitable choices. In this particular example, a combination of Chebyshev polynomials for $r=[0\ 1]$ and a Fourier series for $\theta=[0\ 2\pi]$ may be appropriate. These functions are shown in FIG. 5 (Chebyshev polynomial) and FIG. 6 (Fourier series).

Figure 5:
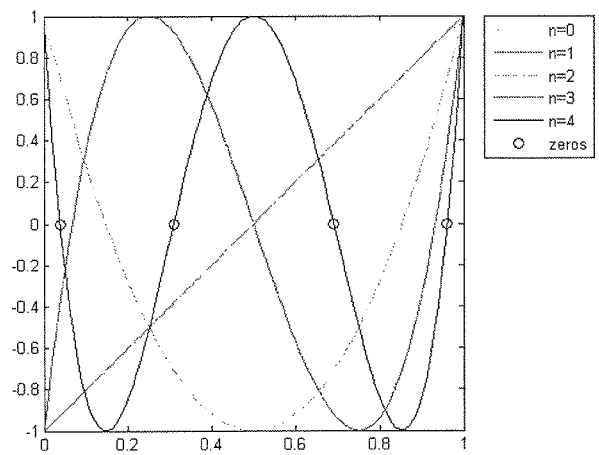
FIG. 5 depicts a Chebyshev polynomial.

As can be seen from FIG. 5, for the various orders of Chebyshev polynomial $n=0, 1, 2, 3, 4$ the polynomials are orthogonal over the interval [0 1] with extrema at 1 and −1. The polynomials are entirely predictable from a small number of points, with the coefficients totally determinable by sampling at the positions corresponding to the zeros of the polynomials.

Figure 6:
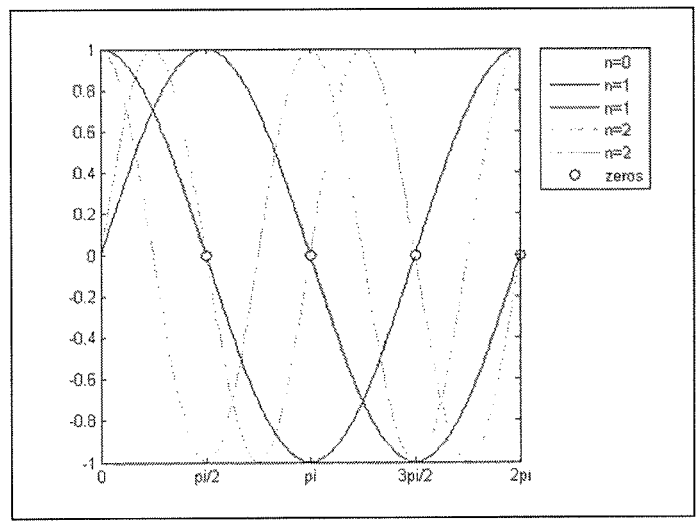
FIG. 6 depicts a Fourier series function.

Turning now to the Fourier series shown in FIG. 6, which shows the orders $n=0, 1, 1, 2, 2$, the series is orthogonal over $[0, 2\pi]$ with extrema at 1 and −1.

Figure 7:
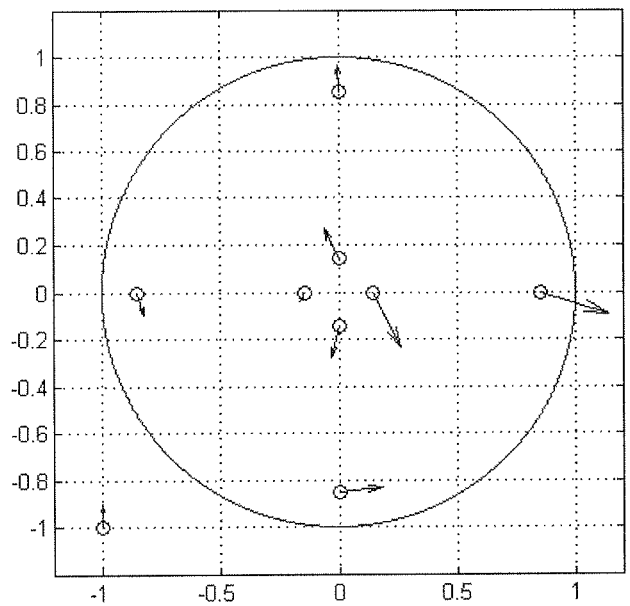
FIG. 7 depicts a number of measurement points overlaid on a grid system incorporating a second order Chebyshev polynomial and a second order Fourier series.

Turning now to FIG. 7, this figure illustrates eight measurement points shown as circles on a substrate W mapped onto a grid produced as translation Tx and Ty co-ordinates, the misalignment vectors, that is the difference between the measured value and the value of the original pattern before projection being shown as arrows. The circled points correspond to the zeros of the basis functions as indicated as circles in FIGS. 5 and 6. It will be appreciated that for clarity only Tx and Ty mapping is shown, with no rotation or magnification measurements.

Figure 8:
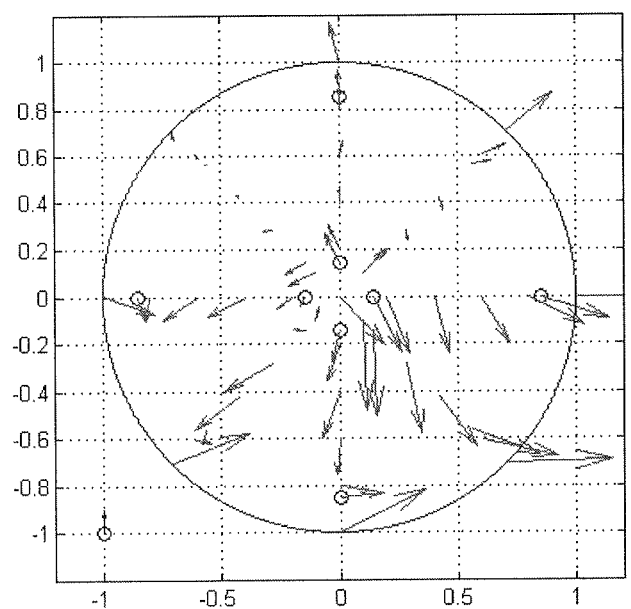
FIG. 8 depicts translations in the X and Y directions across the whole wafer for the grid shown in FIG. 7.

Referring now also to FIG. 8, this Figure illustrates the corresponding misalignment output vectors for points across the substrate which are calculated by the processor 25 from the grid namely the model of the variation of the substrate properties across the substrate. The output vectors may be completely determined by the measurements at the zeros of the basis functions.

The values of the substrate properties, in this case the position or overlay, found from the grid can be expressed in the equation:

$$Y=CX$$

where: C is a design matrix built from the orthogonal basis functions; Y are the output values, that is the vectors shown as dotted arrows in FIG. 8; and X are parameters of the model.

Accordingly, the design matrix C is selected to represent the model of the variation of the one or more properties of the substrate across the substrate by relating the parameters of the model to measurement data of one or more properties of the substrate from the available sample positions. By choosing orthogonal basis functions and sampling at the zeros of the functions, C may be well conditioned and non-singular.

It will be appreciated that whilst in the embodiment described here by way of example, a combination of Chebyshev polynomials and Fourier series orthogonal basis functions have been used, one single orthogonal basis function or a combination of any suitable orthogonal basis function may be used. Examples of suitable basis functions include Zernike functions, Gegenbauer polynomials, Hermite polynomials, Jacobi polynomials etc. It will be appreciated that this list is not exhaustive. The choice of the function or functions may depend on such factors as the shape of the wafer, a function such as a Fourier series being most appropriate for the θ polar co-ordinate of a circular wafer, whilst other functions are more appropriate for other shaped wafers. The choice of the function or functions may depend on the expected shape of the variation across the substrate of a property of the substrate. Furthermore, the invention is not limited to polynomial model description. In general, any model description that can be expressed as Y=CX may be used.

It will be appreciated that, once the design matrix C has been generated, as above, it may be combined with the parameters X of the model that may be determined from the measurement data of the properties of the substrate at the sample positions in order to provide a representation of the variation across the substrate of the one or more properties of the substrate.

Such a representation may be used in a lithographic process. In particular, a first process of a lithographic process may be performed on a substrate, for example the formation of a first layer of a device. The substrate may then be inspected, for example within the alignment measurement system 23. The data from the inspection may then be used to determine a representation of the variation across the substrate of one or more properties of interest of the substrate. This representation may then be used to control the subsequent performance of a second process of the lithographic process, such as the formation of a second layer of a device on the substrate.

In order to obtain the parameters X for use with the model, the parameters are updated from a previous set of parameters using a weighting algorithm such as $$X_n = (1-\lambda)X_{n-1} + \lambda * C^{-1} Y_n$$

where $X_n$ are the updated parameters; $X_{n-1}$ are the previous parameters; C–'1' denotes the pseudo inverse of the design matrix C; Yn are the latest measurement data; and λ is a waiting factor.

It has also been known to use the well-known Kalman filter in order to obtain updates of the parameters X. Such an arrangement beneficially may make the optimum estimation of the parameters where there is a paucity of measurement data and may take into account the expected noise in the system, both of the measurement data and of the process itself. In particular, the parameters X may be updated by the equation $$X_n = X_{n-1} + K*(Y_n - C*X_{n-1})$$

in which K is the Kalman gain matrix.

The Kalman gain matrix may be derived from the design matrix C representing the model in a conventional manner, for example using the iterative Ricatti equation. This is explained, for example, in "Predictive Control with Constraints", J M Maciejowski, page 226, which is incorporated herein by reference in its entirety. Some further detail of this is provided below.

Accordingly, the Kalman filter may be used in order to update the parameters X of the model of the variation of a property of a substrate across the substrate from measurement data obtained at sample positions. However, in an embodiment of the present invention, it has been realized that the Kalman gain matrix K may also be used for an entirely different purpose.

In particular, the Kalman gain matrix K may be used in order to analyze the model representing the variation of the one or more properties of interest of the substrate across the substrate in order to select from the available sample positions a subset of sample positions that have the greatest effect on the model. In other words, according to an embodiment of the invention, it is possible to select the sample positions to be used that provide the most information about the variation of the property across the substrate.

Therefore, in an embodiment of the invention, an initial representation of a model of the variation of the one or more properties of the substrate across the substrate is defined utilizing all of the available sample positions on the substrate. This set of available sample positions may be defined, for example, by the arrangement of a layout of patterns to be formed on the substrate.

The initial representation of the model may be a design matrix C, as discussed above, relating the various parameters X of the model to the measurements that may be obtained at each of the available sample positions.

The model may then be analyzed, for example using the Kalman gain matrix K derived from the design matrix C, as explained further below, in order to determine the effect of the measurements from each of the available sample positions on the model. The effect of each of the available sample positions may then be ranked, permitting the selection of the sample position that are identified as having the greatest effect.

It will be appreciated that, once the subset of sample positions is selected, a revised design matrix C for subsequent use may be defined, providing a revised representation of the model for use in the lithography process in which measurement data is only provided for the subset of sample positions.

As noted above, the Kalman gain matrix K may be used in order to asses the initial representation of the model. In particular, the Kalman gain matrix may have M rows, that correspond to the M parameters of the initial representation of the model, and N columns, that each correspond to the available sample positions.

The assessment of the Kalman gain matrix K may be performed in a number of ways. For example, by summing all of the values of each column of the Kalman gain matrix, one may obtain a figure of merit for the effect of each of the sample positions.

Alternatively, the figure of merit for each sample position to be used to rank the effect of each of the sample positions may be determined by calculating a norm of each column vector of the Kalman gain matrix K. For example, a Euclidean norm or 2-norm may be used or, more generally, any p-norm may be used.

In one arrangement, before the figure of merit is determined for each column of the Kalman gain matrix K, for example by either method discussed above, the Kalman gain matrix K is first normalized. For example, the Kalman gain matrix K is adjusted such that the norm of each of the rows is equal. This may prevent the selection of only measurement positions that include information on just a few parameters but which provide a relatively large amount of information for that limited set of parameters.

It will be appreciated that other appropriate methods may also be used in order to rank the effect of each of the columns of the Kalman gain matrix K.

Once the columns of the Kalman gain matrix K have been ranked, the sample positions corresponding to the highest ranked columns of the Kalman gain matrix K may be selected for the subset of sample positions to be subsequently used.

Alternatively, an iterative approach may be used. Accordingly, once the columns of the Kalman gain matrix K have been ranked, a predetermined number of sample positions, corresponding to the lowest ranked columns of the Kalman gain matrix K may be selected for elimination. Subsequently, an intermediate representation of the model of the variation of the properties of the substrate across the substrate may be defined for a set of sample positions that includes the available sample positions less any eliminated sample positions. For this representation of the model, a new design matrix C may be generated and, in turn, a new Kalman gain matrix K may be identified. The new Kalman gain matrix K may then be assessed by the methods above in order to identify further sample positions for elimination. The process may be repeated until the set of sample positions, including the available sample positions less the eliminated sample positions, is the desired size, e.g., is the subset of sample positions for subsequent use.

It will be appreciated that any appropriate number of sample positions may be eliminated during each iteration. If a single sample position is eliminated each iteration, a more accurate identification of the sample points providing the most information may be performed. However, a greater number of calculations will be required.

In an embodiment of the invention, the assessment of the initial representation of the model (and, if appropriate, intermediate representations of the model) may take into account the expected process noise of the system, which may include the measurement noise. In particular, in the determination of the Kalman gain matrix K, a covariance matrix R, representing the expected process noise as a function of the position on the substrate can be used, as described below. As will be understood, the process noise covariance matrix R is configured to have the same number of rows and columns as the number of sample positions. The process noise covariance matrix R may be generated using knowledge from previous experience of the process noise or, for example, from experiments.

Alternatively or additionally, the analysis of the initial representation of the model (and, if appropriate, intermediate representations of the model) may take into account the expected variation in the parameters of the model, which may be determined from past experience or from an understanding of the underlying physics of the process. This variation may be represented in a parameters covariance matrix Q, in a similar manner to the process noise covariance matrix R. It will be appreciated that parameters covariance matrix Q will have the same number of rows and columns as there are parameters in the model.

The iterative Ricatti may then be used to determine the Kalman gain matrix K from C, Q and R. If no data is available on the expected process noise or the expected variation in the parameters, one or both of Q and R may be replaced with an identify matrix of the appropriate size. For example, in order to determine the Kalman gain matrix K, an initial value of P may be set to equal Q and the following steps are iterated:

$POld=P$ a value of K is then determined $K=P*C'*inv(C*P*C'+R)$

P is updated $P=(I-K*C)*P$ $P=P+Q$

Figure 9A:
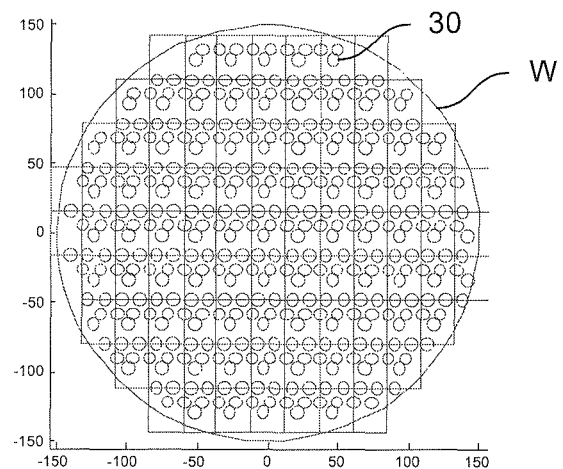
FIG. 9a depicts the arrangement of all available sample positions on a substrate.
Figure 9B:
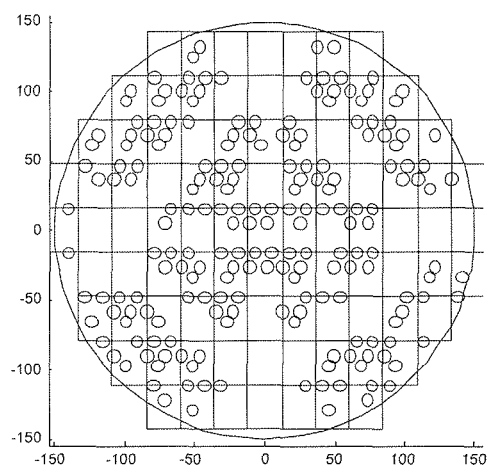
FIGS. 9b, 9c and 9d depict the arrangement of subsets of sample positions on a substrate selected according to the invention.
Figure 9C:
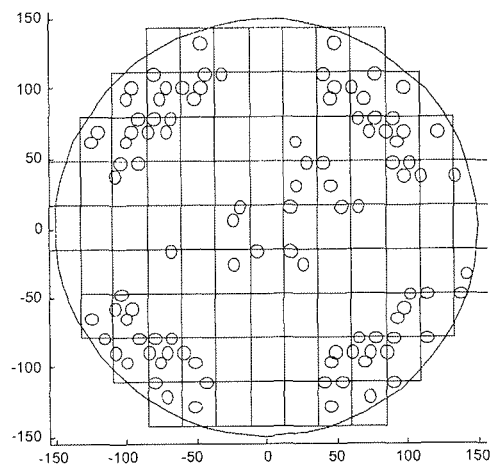
Figure 9D:
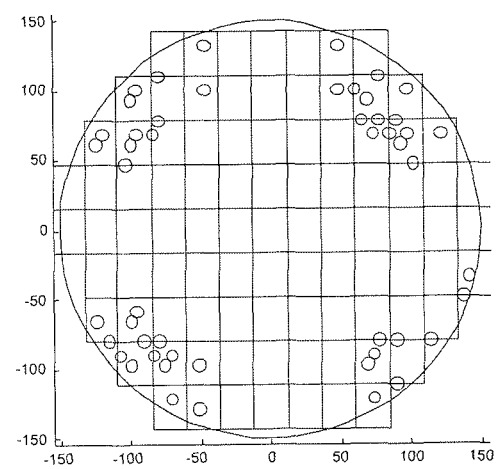

These steps are repeated until the change in P between subsequent iterations is below a given threshold or until a desired number of iterations have been completed. Once the iterations are completed, the steady state Kalman gain matrix K is found to be $K=P*C'inv(C*P*C'+R)$ FIGS. 9a-9d depicts an example of the selection of sample positions 30 from the available sample positions on a substrate W. For example, FIG. 9a depicts all of the available sample positions 30 on a substrate W. FIGS. 9b, 9c and 9d depict possible subsets of sample positions that may be selected, depending upon the size of subset that may be selected. In general, it will be appreciated that the selection of the size of subset to use will be a compromise between the accuracy of the representation of the variation of the properties of the substrate across the substrate that is provided using the measurement data from the subset of sample positions and the length of time that is required to obtain the measurement data from the subset of the sample positions.

It should be appreciated that the methods discussed above for selecting and using a subset of sample positions from the available sample positions may be determined for each arrangement of patterns that may be formed on substrates. For example, the methods may be utilized as part of the process for preparing for the manufacture of new or modified devices on a substrate. Once the reticle pattern, including the layout of the available sample positions, has been designed, the methods explained above may be used in order to determine which of the available sample positions may be used during each part of the process.

According to an embodiment of the invention, the methods explained above may not only take into account the particular arrangement of patterns to be formed on substrate but may also be performed in respect of a particular lithographic apparatus that is to be used to perform a lithographic process. For example, the impact of the particular lithographic apparatus may be taken into account in generating the design matrix C. Furthermore, where the covariance matrices Q and/or R are being used, these may be generated taking into account the known or measured characteristics of particular lithographic apparatus.

Similarly, the methods explained above may take into account some or all of a lithographic system. Accordingly, for example, C, Q and R may be initially set taking into account known and/or measured variations introduced by each apparatus that will be used in order to process a substrate or perform part of a process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A device manufacturing method, comprising:
   performing a first process of a lithographic process to a substrate;
   providing a representation of a model of a variation of a plurality of properties of the substrate across the substrate wherein providing the representation of the model of variation comprises:
   identifying a plurality of available sample positions on the substrate for measurement of the plurality of properties of the substrate;
   defining an initial representation of the model of a variation of the plurality of properties of the substrate across the substrate, wherein the initial representation of the model of variation is configured to represent the variation of the plurality of properties of the substrate across the substrate when provided with measurements of the plurality of properties of the substrate at the available sample positions on the substrate;
   analyzing the initial representation of the model of variation in order to determine the samples positions of the available sample positions having greater effect on the model of variation, wherein analyzing comprises:
   ranking the available sample positions at least based on the effect of the measurements from each of the available sample positions on the model of the variation;
   selecting, from the available sample positions, a subset of sample positions that are identified in the analysis of the initial representation of the model as having greatest effect on the model;
   defining a revised representation of the model of the variation of the plurality of properties of the substrate across the substrate, wherein the revised representation of the model is configured to represent the variation of the plurality of properties of the substrate across the substrate when provided with measurements of the plurality of properties of the substrate at the subset of sample positions; and performing a second process of a lithographic process to a substrate, wherein the performance of the second process is controlled using the revised representation of the model of variation.

2. A method for selecting a subset of sample positions from a set of available sample positions on a substrate processed in a lithographic process, the subset to be used to assess variation of a plurality of properties of the substrate across the substrate, the method comprising:

defining an initial representation of a model of the variation of the plurality of properties of the substrate across the substrate, wherein the initial representation of the model of variation is configured to represent the variation of the plurality of properties of the substrate across the substrate in response to providing measurements of the plurality of properties of the substrate at the available sample positions on the substrate;

analyzing the initial representation of the model of variation in order to determine the samples positions of the available sample positions having greater effect on the model of variation, wherein analyzing comprises:
ranking the available sample positions at least based on the effect of the measurements from each of the available sample positions on the model of the variation; and selecting, for the subset of sample positions, the sample positions of the available sample positions that are identified in the analysis of the initial representation of the model of variation as having greatest effect on the model of variation.

3. The method of claim 2, wherein the method is performed with respect to a particular arrangement of patterns to be formed on a plurality of substrates.

4. The method of claim 2, wherein the method is performed with respect to a particular arrangement of patterns to be formed on a plurality of substrates by a particular lithographic apparatus.

5. The method of claim 2, wherein the method is performed with respect to a particular arrangement of patterns to be formed on a plurality of substrates by a particular arrangement of a lithographic system.

6. The method of claim 2, wherein the initial representation of the model of the variation of the plurality of properties of the substrate across the substrate comprises at least one basis function describing a property of the substrate as at least a second order polynomial function of a position on the substrate.

7. The method of claim 2, wherein analyzing if the initial representation of the model of variation further comprises:

representing the model of variation as a design matrix relating parameters of the representation of the model of variation to measurement data of the plurality of properties of the substrate from the available sample positions;

generating from the design matrix a Kalman gain matrix that may be used to derive parameters of the initial representation of the model of variation from the measurements data of the plurality of properties of the substrate from the available sample positions; and assessing the Kalman gain matrix in order to identify the subset of sample positions having the greatest effect on the model of variation.

8. The method of claim 7, wherein a covariance matrix based on expected process noise of the lithographic system is used when generating the Kalman gain matrix.

9. The method of claim 7, wherein a covariance matrix based on expected variation of the plurality of properties of the substrate across the substrate is used when generating the Kalman gain matrix.

10. The method of claim 7, wherein the Kalman gain matrix comprises columns and rows, each column corresponds to the parameter of the initial representation of the model of variation, and each row corresponds to the available sample positions.

11. The method of claim 7, wherein assessing the Kalman gain matrix comprises summing all values in each column of the Kalman gain matrix in order to determine a figure of merit for the effect of the measurements from each of the available sample positions, the figure of merit is used for ranking the available sample positions.

12. A method of providing a representation of a model of variation a plurality of properties of a substrate across the substrate processed in a lithographic apparatus, comprising:

identifying a plurality of available sample positions on the substrate for measurement of the plurality of properties of the substrate;

defining an initial representation of the model of a variation of the plurality of properties of the substrate across the substrate, wherein the initial representation of the model of variation is configured to represent the variation of the plurality of properties of the substrate across the substrate when provided with measurements of the plurality of properties of the substrate at the available sample positions on the substrate;

analyzing the initial representation of the model of variation in order to determine the samples positions of the available sample positions having greater effect on the model of variation, wherein analyzing comprises:
ranking the available sample positions at least based on the effect of the measurements from each of the available sample positions on the model of the variation;

selecting, from the available sample positions, a subset of sample positions that are identified in the analysis of the initial representation of the model as having greatest effect on the model; and defining a revised representation of the model of the variation of the plurality of properties of the substrate across the substrate, wherein the revised representation of the model is configured to represent the variation of the plurality of properties of the substrate across the substrate when provided with measurements of the plurality of properties of the substrate at the subset of sample positions.

13. The method of claim 12, further comprising:
measuring the plurality of properties at the subset of sample positions to provide measurement data; and
generating a representation of the variation of the plurality of properties of the substrate across the substrate by providing the measurement data to the revised representation of the model of variation.

* * * * *

UNITED STATES PATENT AND TRADEMARK OFFICE
CERTIFICATE OF CORRECTION

PATENT NO.       : 8,504,333 B2                                   Page 1 of 1
APPLICATION NO.  : 12/816723
DATED            : August 6, 2013
INVENTOR(S)      : Mos et al.

It is certified that error appears in the above-identified patent and that said Letters Patent is hereby corrected as shown below:

In the Claims

In claim 7, column 15, line 51, please delete "if" and insert --of--

Signed and Sealed this
Twenty-fourth Day of December, 2013

Margaret A. Focarino
*Commissioner for Patents of the United States Patent and Trademark Office*